US009564931B1

(12) United States Patent
Nguyen et al.

(10) Patent No.: US 9,564,931 B1
(45) Date of Patent: Feb. 7, 2017

(54) SYSTEMS AND METHODS FOR USING DECODERS OF DIFFERENT COMPLEXITY IN A HYBRID DECODER ARCHITECTURE

(71) Applicant: MARVELL INTERNATIONAL LTD., Hamilton (BM)

(72) Inventors: Dung Viet Nguyen, San Jose, CA (US); Shashi Kiran Chilappagari, San Jose, CA (US); Nedeljko Varnica, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 80 days.

(21) Appl. No.: 14/591,636

(22) Filed: Jan. 7, 2015

Related U.S. Application Data (60) Provisional application No. 61/925,456, filed on Jan. 9, 2014.

(51) Int. Cl.
*H03M 13/00* (2006.01)
*H03M 13/37* (2006.01)
*H03M 13/11* (2006.01)

(52) U.S. Cl.
CPC ..... *H03M 13/3707* (2013.01); *H03M 13/1108* (2013.01); *H03M 13/1111* (2013.01)

(58) Field of Classification Search
CPC .......... H03M 13/1108; H03M 13/1131; H03M 13/2909
See application file for complete search history.

(56) References Cited

U.S. PATENT DOCUMENTS

| 9,048,871 B2 * | 6/2015 | Varnica .............. H03M 13/1108 |
| 2005/0283708 A1 | 12/2005 | Kyung et al. |
| 2012/0185744 A1 * | 7/2012 | Varnica .............. H03M 13/1108 714/752 |
| 2013/0283131 A1 | 10/2013 | Tsatsaragkos et al. |
| 2014/0229806 A1 | 8/2014 | Li et al. |

* cited by examiner

*Primary Examiner* — Sam Rizk (57) ABSTRACT

Systems and methods are provided for decoding a codeword having a first codeword length using a decoding system. The systems and methods include receiving a vector corresponding to the codeword at the decoding system, wherein the decoding system comprises a first decoder and a second decoder, the first decoder is available to concurrently process codewords up to the first codeword length, and the second decoder is available to concurrently process codewords up to a second codeword length. The systems and methods further include determining that the received vector is to be decoded using the second decoder, partitioning the received vector of the first codeword length into a plurality of segments having a size no larger than the second codeword length, and decoding the plurality of segments using the second decoder.

19 Claims, 7 Drawing Sheets

SYSTEMS AND METHODS FOR USING DECODERS OF DIFFERENT COMPLEXITY IN A HYBRID DECODER ARCHITECTURE

CROSS REFERENCE TO RELATED APPLICATION

This disclosure claims the benefit under 35 U.S.C. §119 (e) of U.S. Provisional Application No. 61/925,456, filed on Jan. 9, 2014, which is hereby incorporated by reference herein in its entirety.

FIELD OF USE

The present disclosure relates generally to error-correcting systems and methods and, more particularly, to a hybrid decoder architecture that includes primary and secondary decoders with different levels of complexity.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

This disclosure relates generally to data decoding, and more particularly to a hybrid decoder architecture that utilizes primary and secondary decoders with different levels of complexity. While the primary decoder may concurrently decode an entire received codeword, the higher-complexity secondary decoder may sequentially decode the received codeword by breaking it up into two or more codeword portions. In this way, the secondary decoder may be available to decode codewords having a codeword length greater than the maximum codeword length supported by the secondary decoder for concurrent decoding. In some aspects, a class of LDPC codes for which such successive decoding can be supported may be referred to as cascade LDPC codes.

LDPC codes have become an important component of some error-correcting systems. LDPC codes may employ several different kinds of parity check matrices. For example, the structure of an LDPC code's parity check matrix may be random, cyclic, or quasi-cyclic. LDPC codes defined by quasi-cyclic parity check matrices are particularly common and computationally efficient. These codes are known as quasi-cyclic low density parity check (QC-LDPC) codes.

The structure of an LDPC code's parity check matrix may determine what types of decoding algorithms may be used with that LDPC code. For example, for QC-LDPC codes, layered decoding techniques may be used, which exploit the fact that a QC-LDPC code's parity check matrix consists of circular submatrices or so-called "circulants." The size of these circulants corresponds to the number of check node processors necessary to implement layered decoding and determines to what extent the processing of the parity check matrix can be parallelized. For example, a parity check matrix composed of circulants of size $S_c$ can be implemented using $S_c$ check node processors.

As used herein, the term "message" refers to a numerical value, usually representing a log likelihood ratio (LLR). An LDPC decoder may decode LDPC codes using an iterative message-passing algorithm, such as a min-sum decoding algorithm. Iterative algorithms of this type may decode a received codeword using an iterative process in which each iteration includes two update steps involving check nodes and variable nodes.

SUMMARY OF THE DISCLOSURE

In accordance with an embodiment of the present disclosure, a method is provided for decoding a codeword having a first codeword length using a decoding system. The method includes receiving a vector corresponding to the codeword at the decoding system, wherein the decoding system comprises a first decoder and a second decoder, the first decoder is available to concurrently process codewords up to the first codeword length, and the second decoder is available to concurrently process codewords up to a second codeword length. The method further includes determining that the received vector is to be decoded using the second decoder, and partitioning the received vector of the first codeword length into a plurality of segments having a size no larger than the second codeword length, in response to determining that the received vector is to be decoded using the second decoder. The method further includes decoding the plurality of segments using the second decoder.

In some implementations, the first decoder may perform decoding based on a bit-flipping algorithm and the second decoder may perform decoding based on an iterative message-passing algorithm.

In some implementations, the codeword may belong to a low-complexity parity check (LDPC) code having a parity check matrix, and partitioning the received vector may include partitioning the received vector into a plurality of segments based on a structure of the parity check matrix.

In some implementations, determining that the received vector is to be decoded using the second decoder may include attempting to decode the received vector with the first decoder, and determining that the decoding attempt has resulted in a decoding failure.

In some implementations, the method may further include generating soft information based on the received vector, wherein the generated soft information has a third codeword length.

In some implementations, the method may further include determining that the received vector is to be decoded using the first decoder, and decoding the received vector concurrently using the first decoder, in response to the determining.

In some implementations, decoding the plurality of segments using the second decoder may include processing a first segment of the received vector using the second decoder to obtain a decoding estimate of a first segment of the codeword, and processing, using the second decoder, a second segment of the received vector and the decoding estimate of the first segment of the received vector to obtain a decoding estimate of a second segment of the codeword.

In some implementations, a first decoding algorithm used by the first decoder may have lower complexity than a second decoding algorithm used by the second decoder.

In accordance with an embodiment of the present disclosure a decoding system is provided that includes a first decoder available to concurrently process codewords up to a first codeword length, and a second decoder available to concurrently process codewords up to a second codeword length. The decoding system may further include control circuitry configured to receive a vector corresponding to a codeword having the first codeword length, and determine that the received vector is to be decoded using the second decoder. In response to determining that the received vector is to be decoded using the second decoder, the control circuitry may partition the received vector of the first codeword length into a plurality of segments having a size no larger than the second codeword length, and decode the plurality of segments using the second decoder.

In some implementations, the first decoder may perform decoding based on a bit-flipping algorithm and the second decoder may perform decoding based on an iterative message-passing algorithm.

In some implementations, the codeword may belong to a low-complexity parity check (LDPC) code having a parity check matrix, and the control circuitry may be further configured to partition the received vector into a plurality of segments based on a structure of the parity check matrix.

In some implementations, the control circuitry may be further configured to determine that the received vector is to be decoded using the second decoder by attempting to decode the received vector with the first decoder, and determining that the decoding attempt has resulted in a decoding failure.

In some implementations, the control circuitry may be further configured to generate soft information based on the received vector, wherein the generated soft information has a third codeword length.

In some implementations, the control circuitry may further be configured to determine that the received vector is to be decoded using the first decoder, and decode the received vector concurrently using the first decoder, in response to the determining.

In some implementations, the control circuitry may be further configured to decode the plurality of segments using the second decoder by processing a first segment of the received vector using the second decoder to obtain a decoding estimate of a first segment of the codeword, and processing a second segment of the received vector and the decoding estimate of the first segment of the codeword to obtain a decoding estimate of a second segment of the codeword.

In some implementations, a first decoding algorithm used by the first decoder may have lower complexity than a second decoding algorithm used by the second decoder.

In accordance with an embodiment of the present disclosure a decoding system is provided that includes a first decoder of a first complexity and a second decoder of a second complexity. The decoding system may further include control circuitry configured to receive a vector associated with a codeword, and process the received vector jointly using the first decoder, in response to determining that processing the received vector with the first decoder is associated with a complexity that is less than or equal to the first complexity. The control circuitry may further be configured to process portions of the received vector separately using the second decoder, in response to determining that processing the codeword with the second decoder is associated with a complexity that exceeds the second complexity.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

Systems and methods are provided for decoding codewords using a hybrid decoder architecture including a primary decoder and a secondary decoder. In applications or devices where information may be altered by interference signals or other phenomena, error-correction codes, such as LDPC codes, may provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
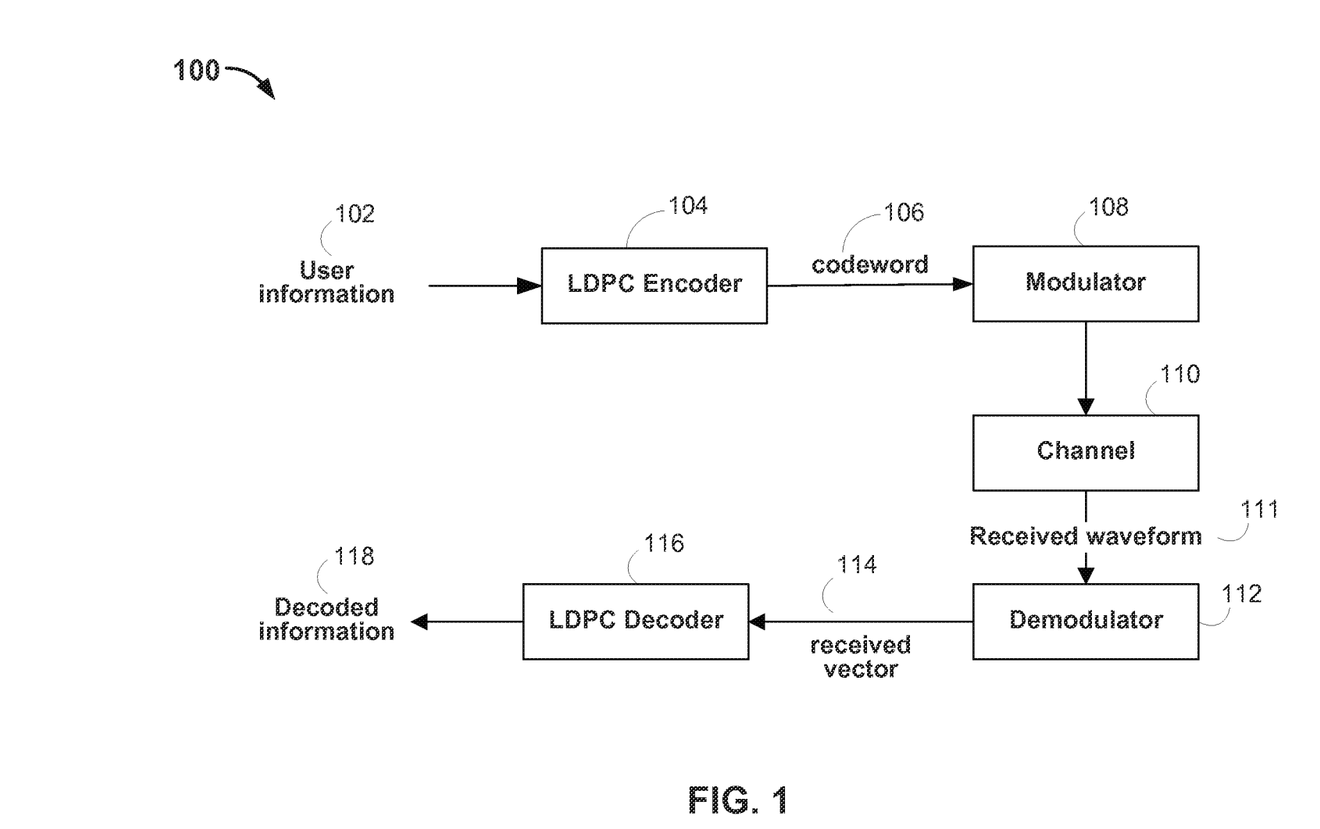
FIG. 1 shows an illustrative communication or data storage system that utilizes error-correction codes for achieving reliable communication or storage in accordance with some embodiments of the present disclosure.

FIG. 1 shows an illustrative communication or data storage system 100 that utilizes error-correction codes for achieving reliable communication or storage in accordance with some embodiments of the present disclosure. User information 102 is encoded through encoder 104. User information 102, often referred to as the message information or a message vector, may be grouped into units of k symbols, where each symbol may be binary, ternary, quaternary, or any other suitable type of data. However, for simplicity, embodiments of the present invention will be described in terms of binary bits. In the process of encoding user information 102, different codes may be used by encoder 104 to achieve different results.

As shown in FIG. 1, encoder 104 may encode user information 102 using a low density parity check (LDPC) code. The result of encoding user information 102 is codeword 106, also denoted as c. Codeword 106 may be of a predetermined length, which may be referred to as n, where n≥k.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114, which may contain errors due to channel corruption.

Received vector 114 may then be processed by LDPC decoder 116. LDPC decoder 116 may be used to correct or detect errors in received vector 114. LDPC decoder 116 may use a circular shifter. A circular shifter may be used by LDPC decoder 116 to decode a quasi-cyclic LDPC code. LDPC decoder 116 may also use an iterative message-passing algorithm or layered decoding to correct or detect errors in received vector 114. LDPC decoder 116 may also use any other iterative decoding algorithm such as a bit flipping algorithm. LDPC decoder 116 may calculate a log-likelihood-ratio (LLR) message (also known as soft information). For example, LDPC decoder 116 may compute a LLR message using the equation $$LLR(b_i) = \log \frac{P(b_i = 0)}{P(b_i = 1)} \qquad \text{Eq. (1)}$$

for each i, where $b_i$ may represent the i-th bit in received vector 114. LDPC decoder 116 may use the computed LLR messages in the message-passing algorithm or in layered decoding. When utilizing such an iterative algorithm, LDPC decoder 116 may perform several iterations of the algorithm until the output of LDPC decoder 116 converges to a valid codeword. In some instances, the output of LDPC decoder 116 may fail to converge to a valid codeword. Decoder failure may be caused by a variety of reasons. Because the output of LDPC decoder 116 may never converge to a valid codeword in certain situations, LDPC decoder 116 may be equipped with a maximum iteration limit, which may be any suitable predetermined number. When LDPC decoder 116 reaches the maximum iteration limit, LDPC decoder 116 may automatically terminate operation and move on to the next received vector 114. However, if the output of LDPC decoder 116 successfully converges to a valid iterative codeword, LDPC decoder 116 may then output decoded information 118.

The LDPC codes processed by encoder 104 of FIG. 1 and LDPC decoder 116 of FIG. 1 are conventionally represented by mathematical vector models. In particular, an LDPC code may be described by its parity check matrix H. Parity check matrix H may be of size m×n, corresponding to codewords of length n and syndromes of length m. Codewords may be, for example, n-length codeword 106 or n-length received vector 114 of FIG. 1. Syndrome length m may satisfy the inequality m≥n−k where k is the length of the information being encoded (e.g., the length of user information 102 of FIG. 1). When parity check matrix H is multiplied by codeword c, the result is an all-zero vector, which is a vector of size m×1 where all elements equal zero, i.e., $$Hc^T = 0. \qquad \text{Eq. (2)}$$

Parity check matrix H has a maximum column weight defined to be the maximum of the set of the number of nonzero entries in each column of parity check matrix H. Parity check matrix H is not unique, and may be chosen, for example, to be computationally convenient and/or to decrease the number of errors generated by the message-passing algorithm in LDPC decoder 116. As discussed in relation to FIG. 1, codeword c may be decoded in LDPC decoder 116 to produce decoded information 118.

Figure 2:
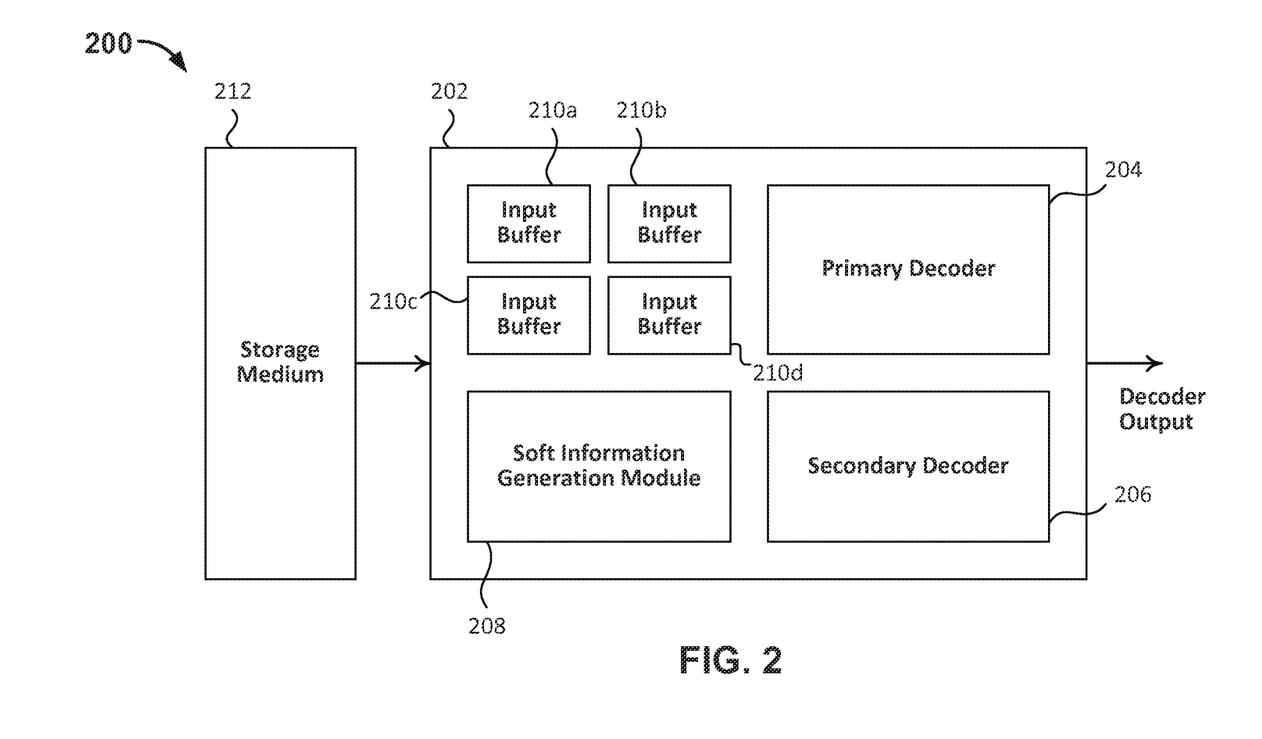
FIG. 2 shows an illustrative block diagram of a hybrid decoder architecture, in accordance with some embodiments of the present disclosure.

FIG. 2 shows an illustrative block diagram of a hybrid decoding architecture 200, in accordance with some embodiments of the present disclosure. Hybrid decoding architecture 200 may include storage medium 212 and hybrid decoding system 202. Hybrid decoding system 202 may in turn include a primary decoder 204, a secondary decoder 206, a soft information generation module 208, as well as input buffers 210a-210d (generally, input buffer 210). Sometimes secondary decoder 206 may also be referred to as an auxiliary decoder.

In some embodiments, primary decoder 204 and secondary decoder 206 may be configured to perform decoding based on different types of decoding algorithms. As a result of employing different decoding algorithms, primary decoder 204 and secondary decoder 206 may generally be associated with different levels of complexity. For example, in some implementations, one of the decoders may be no more complex than the other. In the remainder of the disclosure, it is assumed that primary decoder 204 is no more complex than secondary decoder 206, although it should be understood that this relationship could be reversed without departing from the scope of the present disclosure.

In some embodiments, primary decoder 204 and secondary decoder 206 may be associated with different decoding tasks. For example, in some implementations, primary decoder 204 may be a low-complexity, high-throughput decoder that processes a received vector as part of a first decoding attempt. If primary decoder 204 performs decoding successfully, the decoded codeword may be provided to subsequent processing blocks (e.g., a host device), and secondary decoder 206 may not be required to process the received vector at all. On the other hand, if a decoding attempt of primary decoder 204 fails, then secondary decoder 206 may process either the received codeword or the partially decoded codeword, or both. If the decoding attempt by secondary decoder 206 is successful, the decoded codeword may be provided to subsequent processing blocks. Otherwise, a decoding failure may be declared.

In some aspects, secondary decoder 206 may only be required to process a fraction of the codewords processed by the primary decoder, such as when secondary decoder 206 only processes codewords for which a decoding attempt by primary decoder 204 has failed. Accordingly, secondary decoder 206 may be a high-complexity, low-throughput decoder, and it may utilize more complex decoding algorithms. Such high-complexity, low-throughput decoding algorithms may not be suitable for processing each of the received vectors for complexity reasons, thus motivating the combination of primary decoder 204 and secondary decoder 206 in hybrid decoding system 202.

Hybrid decoding system 200 may further include soft information generation module 208. Soft information generation module 208 may be used to generate soft information that is suitable for processing by primary decoder 204 and secondary decoder 206. In some implementations, soft information generation module 208 may buffer data associated with one or more read operations. The data for each read operation may consist of hard decisions associated with appropriately selected decision thresholds. Soft information generation module 208 may process the combination of these hard decisions to generate soft information.

Primary decoder 204, secondary decoder 206, and soft information generation module 208 may operate on codewords or codewords segments of different length. For example, primary decoder 204 may be a high-throughput, low-complexity decoder that process codewords of a first codeword length (e.g., four kilobytes). Secondary decoder 204 may be a low-throughput, high-complexity decoder that operates on codeword segments of a second size (e.g., two kilobytes or half of the first codeword length). Soft information generation module 208 may generate soft information with various block lengths, such as the codeword length used by primary decoder 204 or the codeword segment length used by secondary decoder 206. In some implementations, soft information generation module 208 may use yet another codeword segment length. For example, soft information generation module 208 may generate codewords segments with a third segment size (e.g., one kilobyte or one-fourth of the first codeword length). The codeword segments generated by soft information generation module 208 may be stored in input buffer 210, where the generated segments may be concatenated to form codeword segments of larger length. For example, two codeword segments of one kilobyte each may correspond to the codeword length used by secondary decoder 206, and four of the codeword segments may correspond to the four-kilobyte codewords used by primary decoder 204.

In some embodiments, hybrid decoding system 202 may need to decode codewords that have a codeword length that is larger than the maximum codeword length that secondary decoder 206 is able to decode concurrently. Nonetheless, for certain classes of LDPC codes, secondary decoder 206 may still be able to decode such codewords by sequentially decoding portions of the codeword whose length is smaller than or equal to the maximum supported codeword length of secondary decoder 206. Secondary decoder 206 may thus segment the received codeword into a plurality of portions, wherein each portion of length is no greater than the maximum supported codeword length of secondary decoder 206. Upon decoding each of the plurality of portions in a sequential manner, secondary decoder 206 may reassemble the plurality of portions to obtain a decoding estimate of the entire codeword. For example, in accordance with the foregoing example, received codewords may have a length of four kilobytes. Primary decoder 204 may support the concurrent decoding of these codewords, while secondary decoder 206 may only be able to process codeword segments of two kilobytes concurrently. Accordingly, secondary decoder 206 may segment the received codeword into two portions and process them in a sequential manner.

In some aspects, an LDPC code may need to satisfy certain properties to enable secondary decoder 206 to perform such sequential decoding. For example, in order for such sequential decoding to be performed, the parity check matrix of an LDPC code may need to have a certain structure. An example of a class of LDPC codes that satisfies such a structure are cascade LDPC codes. However, it should be understood that cascade LDPC codes may not be the only class of codes that enable such sequential decoding or that may be used in connection with hybrid decoder architecture 200. In contrast, other suitable codes may be used as well without departing from the scope of the present disclosure.

Figure 3:
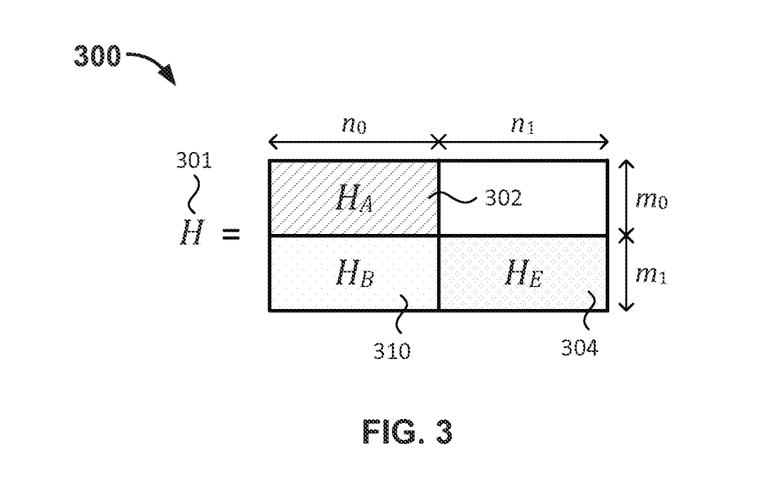
FIG. 3 shows the structure of a cascade LDPC code's parity check matrix, in accordance with some embodiments of the present disclosure.

FIG. 3 shows the structure of a parity check matrix 301 associated with a cascade LDPC code, in accordance with some embodiments of the present disclosure. Parity check matrix 201 may include a number of block matrices, such as block matrix $H_A$ (element 302), block matrix $H_E$ (element 304), and block matrix $H_B$ (element 310). Elements of parity check matrix 201 that do not belong to any of block matrices 302-310 may be equal to zero. Each of block matrices 302-310 may be composed of non-zero and zero elements. For example, for binary LDPC codes, block matrices 302-310 may be composed of entries that are either logical zero or logical one.

Block matrices 302-310 may have different sizes. For example, block matrix $H_A$ may have size $m_0 \times n_0$, block matrix $H_E$ may have size $m_1 \times n_1$, and block matrix $H_B$ may have size $m_1 \times n_0$. As a result of the structural properties of block matrices 302-310, parity check matrix 301 may be a lower block triangular matrix with block matrices 302 and 306 on the main diagonal and block matrix 310 below the main diagonal. Parity check matrix 301 may possess block triangular structure, because once parity check matrix 301 is written as a block matrix, the blocks of parity check matrix 301 may satisfy the triangular constraint. In some implementations, parity check matrix 301 may be used as a building block to construct other types of cascade LDPC codes.

In some embodiments, the parity check matrix of a cascade LDPC code may consist of further block matrices on the main diagonal and below the main diagonal. Cascade LDPC codes may further be categorized as Type A, Type B, or Type C cascade LDPC codes, and systems and methods for decoding such cascade LDPC codes are discussed in, for example, U.S. patent application Ser. No. 14/590,718, filed Jan. 6, 2015, which is hereby incorporated by reference herein in its entirety. In the following, systems and methods for decoding cascade LDPC codes will be described with reference to parity check matrix 301. However, it is understood that the disclosed systems and methods may similarly be applied to parity check matrices of other types of cascade LDPC codes without departing from the scope of the present disclosure.

Codewords belonging to an LDPC code are defined based on parity check equation (2). Accordingly, a codeword c of an LDPC code defined by parity check matrix 301 needs to satisfy the equations $$H_A c_{AB}^T = 0, \qquad \text{Eq. (3)}$$

$$[H_B \ H_E][c_{AB} \ c_E]^T = 0, \qquad \text{Eq. (4)}$$

$$\begin{bmatrix} H_A \\ H_B \end{bmatrix} c_{AB}^T = \begin{bmatrix} 0 \\ H_E c_E^T \end{bmatrix}, \qquad \text{Eq. (5)}$$

where 0 denotes a vector with all zero elements of appropriate size (e.g., $m_0 \times 1$ for equations (3) and (5), and $m_1 \times 1$ for equation (4)). Equations (3)-(5) may result from substituting the block structure of parity check matrix 501 into parity check equation (2). Equation (4) may be rewritten as $H_E c_E^T = H_B c_{AB}^T$ by expanding the matrix multiplication of equation (4).

In some embodiments, if a decoder is able to decode codewords with a maximum codeword length that exceeds $n_0+n_1$, then codeword c may be decoded by processing parity check matrix 301 without taking into account its block structure. However, due to the specific structure of parity check matrix 301, a decoder that is able to decode codewords with a maximum codeword length of only $n_s$, where $n_s$ satisfies $n_0, n_1 < n_s < n_0 + n_1$, may also be used to decode codeword c using an iterative decoding procedure. In particular, a received vector y may first be partitioned into two segments. The first segment $y_{AB}$ may correspond to the first $n_0$ elements of codeword c, and the second segment $y_E$ may correspond to the last $n_1$ elements of codeword c, i.e., $y = [y_{AB} \ y_E]$. The iterative decoding procedure may seek to find estimates $x_{AB}$ and $x_E$ that resemble the actual symbols of the codeword (denoted as $c_{AB}$ and $c_E$) as closely as possible.

In a first step, the iterative decoding procedure may find an estimate $x_{AB}$ of $c_{AB}$ (i.e., the first portion of the codeword) that satisfies $H_A x_{AB}{}^T = 0$ (i.e., a decoding estimate that satisfies parity check equation (3)). Various types of LDPC decoding schemes may be used for this purpose, because parity check equation (3) itself may be viewed as defining an LDPC code in relation to the first portion of the codeword. If a decoding estimate $x_{AB}$ that satisfies $H_A x_{AB}{}^T = 0$ cannot be found for some reason (e.g., because of too much corruption contained in the received vector), a decoding failure may be declared.

In a second step, the iterative decoding procedure may determine an estimate $x_E$ of $c_E$ that satisfies $H_E x_E{}^T = H_B x_{AB}{}^T$ (i.e., parity check equation (4)). In some aspects, the iterative decoding procedure may first compute the matrix product $H_B x_{AB}{}^T$ based on the result obtained in the first step of the iterative decoding procedure and $H_B$ (i.e., block matrix 510). Similar to the first step, the decoding procedure may again use various types of decoding algorithms to obtain the estimate $x_E$. For example, coset decoding schemes may be used to obtain the estimate $x_E$.

If the estimate $x_{AB}$ of the first portion of codeword c is obtained correctly in the first step of the decoding procedure, then $x_{AB} = c_{AB}$ and $H_B x_{AB}{}^T = H_B c_{AB}{}^T$. Therefore, a decoding estimate of the entire received vector may be obtained by combining the estimates obtained in the first step and the second step to yield $x = [x_{AB} \ x_E]$.

In some embodiments, if an estimate of the first portion of the codeword $x_{AB}$ that satisfies $H_A x_{AB}{}^T = 0$ cannot be found, the decoding algorithm may declare an error and decoding may be halted. However, in other embodiments, more complex decoding schemes may be used in order to obtain an estimate x of the transmitted codeword c even in such situations. In particular, because the decoding algorithm may not be able to determine an estimate $x_{AB}$ that satisfies $H_{AB} x_{AB}{}^T = 0$, the decoding algorithm may find instead an estimate $x_{AB}{}^{(0)}$ that satisfies $$H_A(x_{AB}{}^{(0)})^T = r_A{}^{(0)},$$

where $r_A{}^{(0)}$ is a vector with at least one non-zero element; and the superscript "(0)" indicates that this is a first estimate of $x_{AB}$ in an iterative procedure.

Even though the estimate $x_{AB}{}^{(0)}$ may not satisfy parity check equation (3) (i.e., $H_A x_{AB}{}^{(0)} = 0$), the decoding algorithm may still perform the second step of the decoding procedure by finding an estimate $x_E{}^{(0)}$ that satisfies $$H_E(x_E{}^{(0)})^T = H_B(x_{AB}{}^{(0)})^T.$$

Because residual errors are present in $x_{AB}{}^{(0)}$ when $r_A{}^{(0)}$ contains at least one non-zero element, the estimate $x_E{}^{(0)}$ may not necessarily satisfy the equation $$H_E(x_E{}^{(0)})^T = H_B x_{AB}{}^{(0)T}.$$

However, without loss of generality, it may be assumed that $x_E{}^{(0)}$ satisfies $$H_E(x_E{}^{(0)})^T = H_B(x_{AB}{}^{(0)})^T + r_B{}^{(0)},$$

where $r_B{}^{(0)}$ is a vector that represents the residual error. Based on the estimate $x_E{}^{(0)}$, the decoding algorithm may then find a refined estimate $x_{AB}{}^{(1)}$ that satisfies $$\begin{bmatrix} H_A \\ H_B \end{bmatrix}(x_{AB}^{(1)})^T = \begin{bmatrix} 0 \\ H_E(x_E^{(0)})^T \end{bmatrix} = \begin{bmatrix} 0 \\ H_B(x_{AB}^{(0)})^T + r_B^{(0)} \end{bmatrix}.$$

In some aspects, the process of computing estimates $x_{AB}{}^{(i)}$ and $x_E{}^{(i)}$ may be repeated for a number of times, until either an estimate $x_{AB}{}^{(i)}$ is found that satisfies $H_A x_{AB}{}^{(i)} = 0$ or a stopping criterion is met. For example, the stopping criterion may specify that a predetermined number of iterations should not be exceeded. The stopping criterion may differ among iterations. For example, if the stopping criterion specifies that decoding is halted if an amount of residual error (e.g., predicted based on intermediate decoding parameters such as the syndrome weight) is below a given threshold, the value of that threshold may depend on the iteration index (e.g., the threshold value may initially be loose but then tightened as the iterative procedure progresses).

Figure 4:
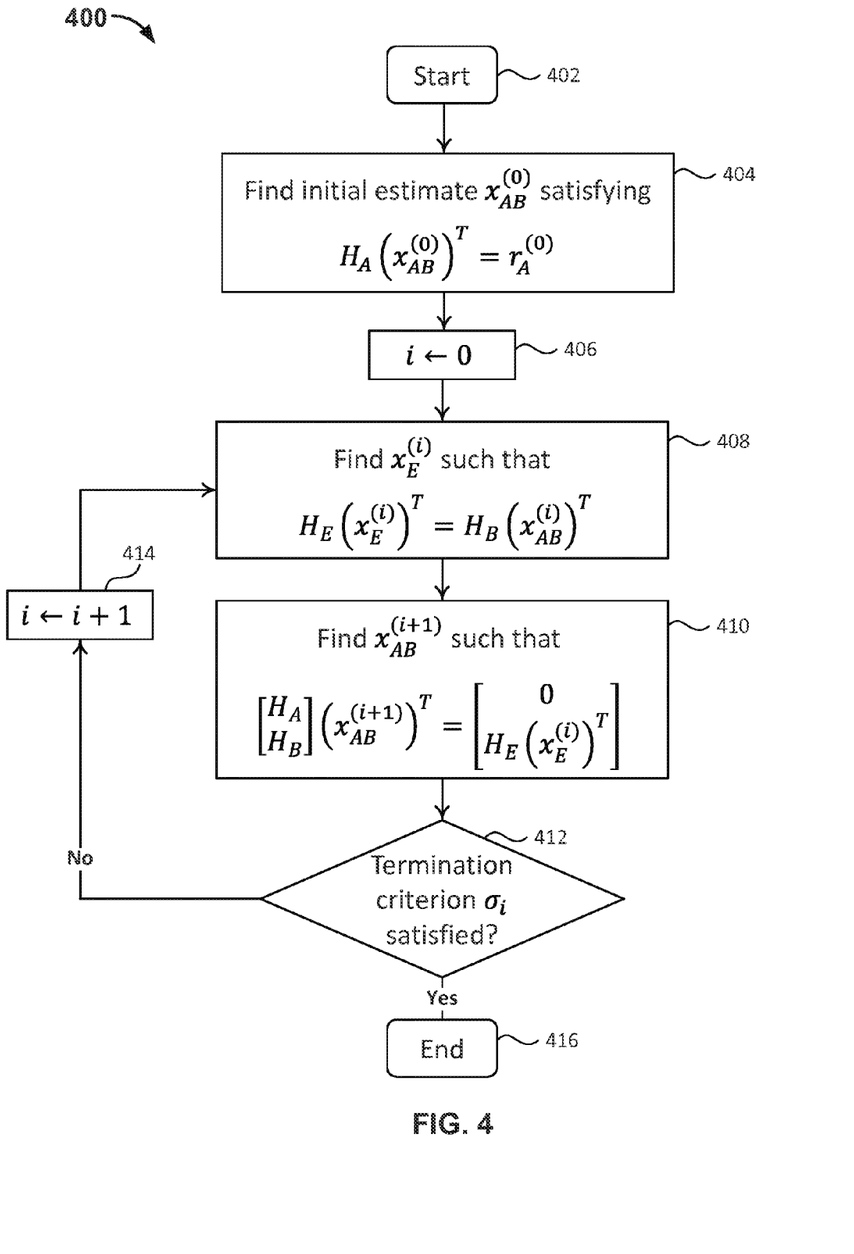
FIG. 4 shows a flow chart illustrating a decoding process for decoding cascade LDPC codes, in accordance with some embodiments of the present disclosure.

FIG. 4 shows a flow chart illustrating a decoding process 400 for decoding cascade LDPC codes, in accordance with some embodiments of the present disclosure. Decoding process 400 may start at 402 by receiving a vector y corresponding to a codeword c encoded with a cascade LDPC code and by partitioning the received vector y into a first portion $y_{AB}$ and a second portion $y_E$ in accordance with the dimensions of the parity check matrix of the cascade LDPC code (e.g., parity check matrix 301). The objective of decoding process 400 may be to find an estimate $x = [x_{AB}, x_E]$ of the actually transmitted codeword $c = [c_{AB}, c_E]$ based on the received vector $y = [y_{AB}, y_E]$. To obtain the decoding estimate x, decoding process 400 may at 404 find an initial estimate $x_{AB}{}^{(0)}$ of a first portion of the transmitted codeword (i.e., the portion corresponding to $y_{AB}$), such that equation (3) is satisfied. In some implementations, decoding process 400 may use LDPC decoding techniques, coset decoding techniques, or any other suitable decoding technique to obtain the estimate. Once the initial estimate $x_{AB}{}^{(0)}$ is obtained, decoding process 400 may initialize an iterative decoding procedure at 406 by setting an iteration value i to zero.

At 408, decoding process 400 may find an estimate $x_E{}^{(i)}$ of the second portion of the transmitted codeword (i.e., the portion corresponding to $y_E$). Similar to step 404, decoding process 400 may use various kinds of decoding schemes to obtain the estimate $x_E{}^{(i)}$, such as LDPC decoding techniques or coset decoding techniques. In some aspects, decoding step 408 may be referred to as Stage A of the decoding process. The decoding estimate $x_E{}^{(i)}$ may be stored in a decoding memory or on some other form of storage medium in order to be accessible in later steps of the iterative decoding process.

At 410, decoding process 400 may find an estimate $x_{AB}{}^{(i+1)}$ such that $$\begin{bmatrix} H_A \\ H_B \end{bmatrix}(x_{AB}^{(i+1)})^T = \begin{bmatrix} 0 \\ H_E(x_E^{(i)})^T \end{bmatrix}$$

is satisfied. As shown in the equation above, decoding process 400 may use the decoding estimate $x_E{}^{(i)}$ of the second portion of the codeword, obtained in the previous iteration, to obtain the estimate $x_{AB}{}^{(i+1)}$. For example, decoding estimate $x_E^{(i)}$ may be stored in a decoding memory, a buffer, or a similar storage medium in order to be retrieved at step 410. Any suitable type of decoding scheme, including LDPC decoding schemes and coset decoding schemes, may be used to obtain estimate $x_{AB}^{(i+1)}$.

At 412, decoding process 400 may determine whether a termination criterion $\sigma_i$ has been satisfied. The index i represents that termination criterion $\sigma_i$ may depend on an index of the current iteration. For example, in some embodiments, the termination criterion may relate to an estimate of the amount of residual error that is present in the decoding estimate, such as by using a syndrome weight. For instance, the termination criterion may be satisfied if a syndrome weight is above or below a predefined threshold.

In some implementations, if termination criterion $\sigma_i$ is satisfied, decoding process 400 may terminate at 416 and the current decoding estimates $x_{AB}^{(i+1)}$ and $x_E^{(i)}$ may be used as the final decoding estimate x of codeword c. Conversely, if termination criterion $\sigma_i$ is not satisfied, decoding process 400 may continue at 414 by increasing the iteration counter by one and resuming at step 408 with Stage A of the decoding procedure.

Figure 5:
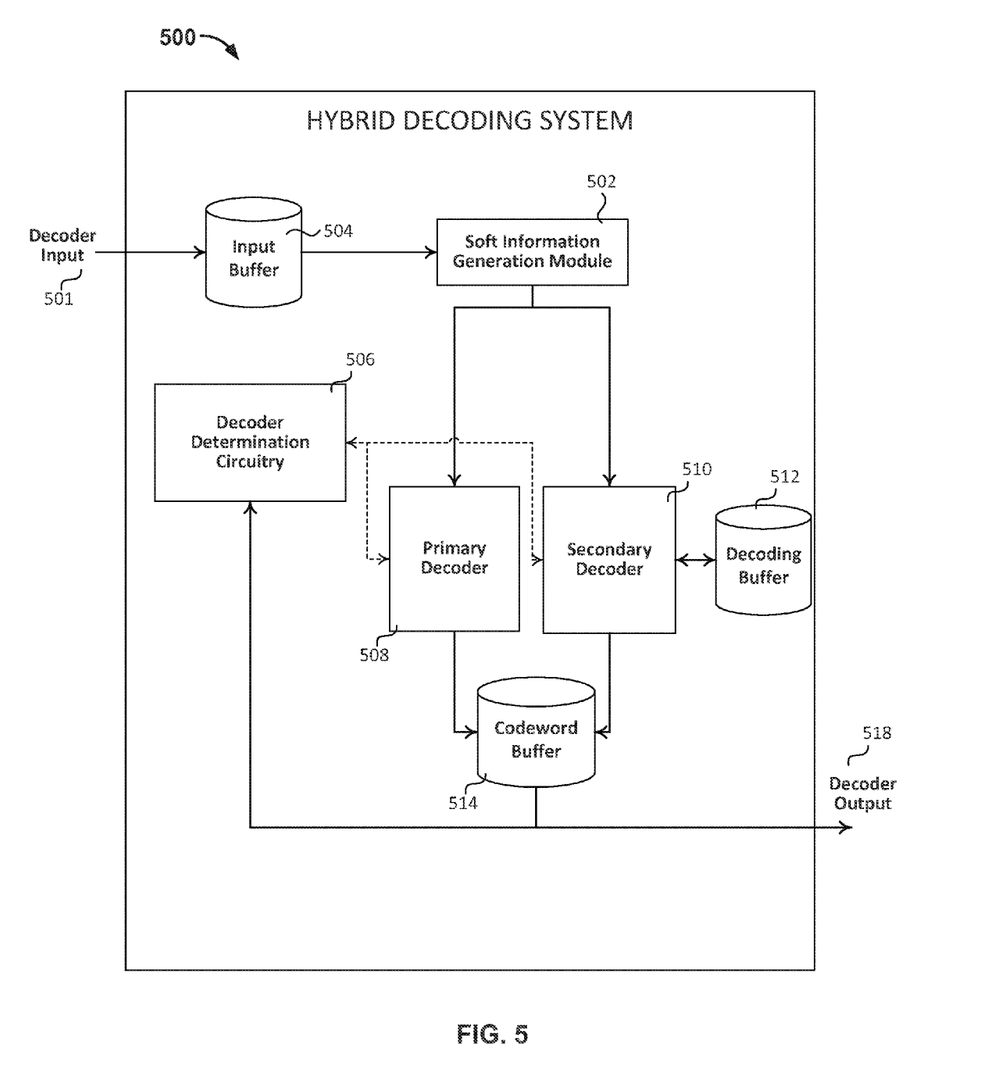
FIG. 5 shows an illustrative block diagram of a hybrid decoding system for decoding cascade LDPC codes, in accordance with an embodiment of the present disclosure.

FIG. 5 shows an illustrative block diagram of a hybrid decoding system 500, in accordance with some embodiments of the present disclosure. Hybrid decoding system 500 may include an input buffer 504 that receives a decoder input 501, such as received vector 114. Soft information generation module 502 may process all or a portion of the received vector stored in input buffer 504 to generate soft information. Hybrid decoding system 500 may further include decoder determination circuitry 506 that selects at least one of primary decoder 508 and secondary decoder 510 to decode processed decoder input stored in input buffer 504. A decoding buffer 512 may be used by secondary decoder 510 to perform decoding of the received vector in a sequential or iterative fashion. Primary decoder 508 may be configured to decode the entire received vector concurrently and may therefore, in some implementations, not require a separate decoding buffer. However, in other implementations, a similar decoding buffer may be used by primary decoder 508, although not shown to avoid overcomplicating the drawing. Decoding estimates for the transmitted codeword, or portions therefore, may be buffered in codeword buffer 514. Primary decoder 508 and secondary decoder 510 may include syndrome computation circuitry, which may determine an accuracy associated with decoding estimates stored in codeword buffer 514. In some implementations, the syndrome computation circuitry of primary decoder 508 or secondary decoder 510 may determine whether the decoding estimate buffered in codeword buffer 514 meets predefined accuracy criteria. If these accuracy criteria are met, the decoding estimate of the received codeword may be provided as decoder output 518. Otherwise, an indication that the predefined accuracy criteria have not been met may be provided to decoder determination circuitry. In response to such an indication, decoder determination circuitry may cause primary decoder 508 and/or secondary decoder 510 to perform further processing, for example, to increase the decoding accuracy.

Input buffer 504 may be similar to input buffer 210 discussed in relation to FIG. 2. Input buffer 504 may receive and store all or a portion of a received vector (e.g., received vector 114) corresponding to a transmitted codeword. In some implementations, the received vector may be expressed in the form of hard decisions (possibly subject to multiple decision thresholds). In other implementations, the received vector may contain soft information with a certain accuracy level. Input buffer 504 may accumulate and store data corresponding to a received vector or vectors (e.g., corresponding to one or more transmitted codewords) until a specific amount of data has been collected (e.g., until the data corresponding to an entire transmitted codeword has been collected). In some implementations, input buffer 504 may be bypassed or omitted and decoder input 501 may directly be provided to soft information generation module 502.

Soft information generation module 502 may perform similar functions as soft information generation module 208 discussed in relation to FIG. 2. Soft information generation module 502 may process all or a portion of the received vector stored in input buffer 504. In some implementations, soft information generation module 502 may receive hard decision input from input buffer 504, whereby each of the one or more hard decisions correspond to a specific value of a decision threshold. Soft information generation module 502 may combine the multiple hard decisions to generate a soft information metric, such as an LLR value. In some implementations, decoder input 501 may already be in the form of soft information. In such a case, soft information generation module 502 may be bypassed and input buffer 504 may provide all or portions of the received vector directly to primary decoder 508, secondary decoder 510, or both. Alternatively, when decoder input 501 corresponds to soft information, soft information generation module 502 may increase or decrease the accuracy of the soft information, for example by changing how many bits are used to represent the soft information. For instance, in an embodiment where decoder input 501 corresponds to a soft information signal with 11-bit accuracy, soft information generation module 502 may reduce the accuracy to a soft information signal with five-bit accuracy (e.g., by discarding some of the least significant bits). Soft information generation module 502 may perform such processing in implementations in which decoder input 501 has higher accuracy than supported by either primary decoder 508 or secondary decoder 510. In some implementations, soft information generation module 502 may process only portions of the data stored in input buffer 504. For example, if transmitted codewords have a length of four kilobytes but soft information generation module 502 is able to process at most two kilobytes of data at a time, soft information generation module 502 may access data segments of two kilobytes at a time from input buffer 504, which stored the data in four kilobyte segments. Soft information generation module 502 may then provide the data segments with a size of two kilobytes to primary decoder 508 and secondary decoder 510.

Primary decoder 508 and secondary decoder 510 may be similar to primary decoder 204 and secondary decoder 206, respectively, as discussed in relation to FIG. 2. In some embodiments, primary decoder 508 may be a low-complexity, high-throughput decoder that is available to process an received vector corresponding to an entire transmitted codeword concurrently. In contrast, secondary decoder 510 may be a high-complexity, low-throughput decoder that processes portions of the received vector in a sequential fashion because the length of the received vector, corresponding to an entire transmitted codeword, exceeds the maximum codeword length that can be processed concurrently by secondary decoder 510. In order to facilitate the sequential processing of the received vector, secondary decoder 510 may utilize a decoding buffer 512 to store intermediate decoding estimate. These intermediate decoding estimates may correspond to decoding estimates of portions of the transmitted codeword. For example, decoding estimates $x_{AB}$ and $x_E$ discussed in relation to FIGS. 3 and 4 may be stored in decoding buffer 512.

In some implementations, primary decoder 508 and secondary decoder 510 may share some common control or decoding circuitry (not shown). Although primary decoder 508 and secondary decoder 510 in general perform decoding using different decoding algorithms (e.g., primary decoder 508 may utilize a lower-complexity algorithm compared to secondary decoder 510), some processing steps, processing blocks, or processing circuitry may be shared.

Upon obtaining a decoding estimate of the transmitted codeword, or a portion thereof, primary decoder 508 and secondary decoder 510 may store the decoding estimates in codeword buffer 514. In some implementations, codeword buffer 514 may accumulate portions of the decoding estimates that are obtained by secondary decoder 510. In other implementations, codeword buffer 514 may receive a decoding estimate for an entire codeword and buffer the decoding estimate for an entire codeword. In some aspects, decoding estimates for multiple codewords may be stored in codeword buffer 514 for further processing, for example, if a decoder output signal provides multiple codewords at the same time. In some implantations, codeword buffer 514 may also be omitted or bypassed and the decoding estimates provided by first decoder 508 and secondary decoder 510 may directly be provided as decoder output 518.

In some implementations, primary decoder 508 and secondary decoder 510 may include syndrome computation circuitry for computing a syndrome or other metric that represents the accuracy of the decoding estimates. The syndrome or metric may be compared to a predefined or dynamic threshold in order to determine whether a desired level of accuracy has been achieved. An indication of this comparison may be provided to decoder determination circuitry 506.

Figure 6:
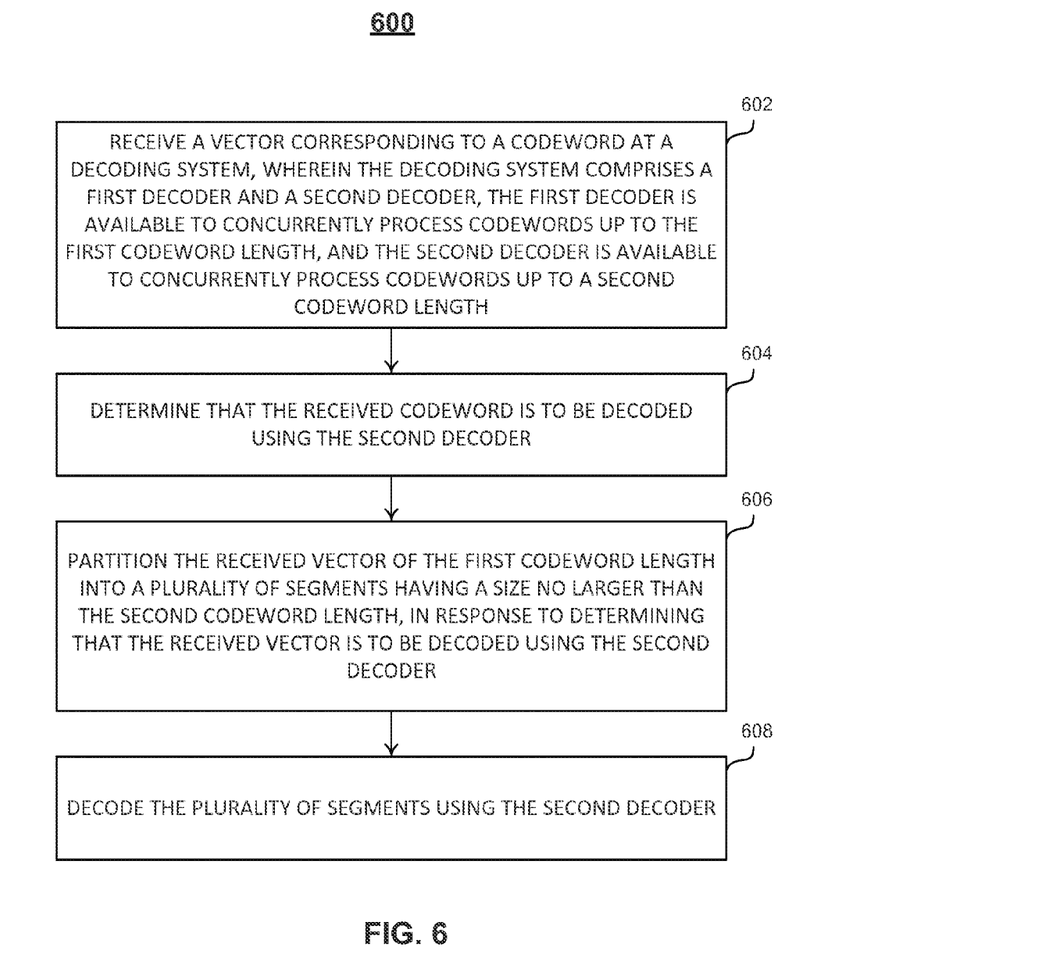
FIG. 6 shows a high-level flow chart of a process for decoding a codeword associated with a cascade LDPC code, in accordance with some embodiments of the present disclosure.

FIG. 6 shows a high-level flow chart of a process 600 for decoding a codeword having a first codeword length using a decoding system, in accordance with some embodiments of the present disclosure. Hybrid decoding system 202 or hybrid decoding system 500 may execute process 600 by, at 602, receiving a vector corresponding to a transmitted codeword at the decoding system, wherein the decoding system comprises a first decoder and a second decoder, the first decoder is available to concurrently process codewords up to the first codeword length, and the second decoder is available to concurrently process codewords up to a second codeword length. At 604, process 600 may determine that the received vector is to be decoded using the second decoder. Process 600 may then, at 606, partition the received vector of the first codeword length into a plurality of segments having a size no larger than the second codeword length, in response to determining that the received vector is to be decoded using the second decoder. Next, at 608, process 600 may decode the plurality of segments using the second decoder.

At 602, hybrid decoding system 202 or hybrid decoding system 500 may receive decoder input corresponding to a codeword. In some implementations, the decoder input may correspond to decoder input 501 discussed in relation to FIG. 5. The decoder input may correspond to one or more hard decisions (e.g., received for multiple decision thresholds) or it may correspond to a soft information signal with a certain level of accuracy. In some implementations, the decoder input may be buffered in an input buffer, such as input buffer 504. The input buffer may store all or portions of a received vector (e.g., received vector 114) corresponding to a transmitted codeword. The decoder input, possibly stored in an input buffer, may be processed by a soft information generation module, such as soft information generation module 208 or 502, to obtain preprocessed decoder input that is suitable for processing by primary decoder 508 and secondary decoder 510. In some implementations, the soft information generation module may process portions of the received vector, and these portions may be provided separately to primary decoder 508 and secondary decoder 510.

At 604, process 600 may determine that the received vector corresponding to a transmitted codeword is to be decoded using the second decoder. In some embodiments, the second decoder may correspond to second decoder 510. The determination that the received vector is to be decoded using the second decoder may be made by decoder determination circuitry 506, as is discussed in relation to FIG. 5. Decoder determination circuitry 506 may make this determination based on various criteria. In a first aspect, decoder determination circuitry 506 may check whether one or more decoding attempts for the received vector have already been made using a first decoder, such as primary decoder 508. If one or more decoding attempts have already been made by the first decoder, but these attempts have been unsuccessful or unsatisfactory, decoder determination circuitry may determine that decoding with the second decoder should be attempted. In some embodiments, the second decoder may be a high-complexity, low-throughput decoder that implements a more sophisticated encoding algorithm compared to the primary decoder. Accordingly, a decoding attempt with the secondary decoder may prove successful even if previous decoding attempts using the primary decoder have failed.

In a second aspect, decoder determination circuitry 506 may compute or extract a metric from the received vector that indicates whether decoding with the primary decoder will likely be successful. For example, decoder determination circuitry may compute a signal-to-noise or a signal-to-interference ratio that may provide a basis for deciding whether the primary decoder or the secondary decoder is more appropriate for processing the received vector. For example, if the received vector is associated with a high signal-to-noise ratio, processing with the primary decoder may likely give a satisfactory result and, accordingly, may be preferred from a complexity standpoint because the primary decoder is a high-throughput, low-complexity decoder. Alternatively, if the signal-to-noise ratio associated with the received vector is low, then it may be preferred to process the received vector with the second decoder, because decoding with the primary decoder would likely fail.

At 606, process 600 may partition the received vector of the first codeword length into a plurality of segments having a size no larger than the second codeword length. In some embodiments, secondary decoder 510 may perform the partitioning. In some implementations, the size of each of the plurality of segments may be equal to the second codeword length, i.e., the maximum codeword length that secondary decoder 510 is able to decode concurrently. The partitioning of the received vector may be performed in response to determining that the received vector is to be decoded using secondary 510. That determination may be made by decoder determination circuitry 506, as discussed in the foregoing paragraphs. In some implementations, the process of partitioning the received vector may make use of decoding buffer 512 to temporarily store portions of the received vector. In other implementations, secondary decoder 510 may retrieve portions of the received vector from input buffer 504 without moving or storing the individual portions of the vector separately.

At 608, process 600 may decode the plurality of segments using the second decoder. In some embodiments, secondary decoder 510 may utilize decoding process 400, as discussed in relation to FIG. 4. For example, secondary decoder 510 may first find an initial estimate of a first portion of the transmitted codeword, similar to the way by which process 400 finds an initial estimate $x_{AB}^{(0)}$ at 404. The size of the first portion of the transmitted codeword may be substantially equal to the size of block matrix 302 of FIG. 3. Next, process 600 may use the decoding estimate of the first portion of the transmitted codeword together with a second portion of the received vector to determine a decoding estimate for the second portion of the transmitted codeword. The second portion of the received vector may be substantially equal to the size of block matrix 304 of FIG. 3. In some aspects, the decoding estimate of the second portion of the transmitted codeword may be obtained by computing an intermediate vector based on the decoding estimate of the first portion of the transmitted codeword and block matrix 310 of FIG. 3. The resulting intermediate vector may then be processed together with the second portion of the received vector and block matrix 304 to find the decoding estimate of the second portion of the transmitted codeword. In some aspects, process 600 may decode the plurality of segments by using the techniques discussed at 408 and at 410 of FIG. 4.

In some embodiments, process 600 may decode the plurality of segments sequentially in an iterative fashion. For example, process 600 may iteratively update the decoding estimates for the first portion of the transmitted codeword and the second portion of the transmitted codeword until a desired level of accuracy has been achieved. Process 600 may use decoding buffer 512 to exchange data associated with this iterative process. For example, a current decoding estimate for the first portion of the transmitted codeword may be stored in decoding buffer 512 such that it can be utilized to obtain an improved decoding estimate of the second portion of the transmitted codeword. Similarly, a current decoding estimate of the second portion of the transmitted codeword may be stored in decoding buffer 512 so that it can be utilized to obtain an improved estimate of the first portion of the transmitted codeword. In some implementations, similar to process 400 at 412, process 600 may utilize a termination criterion to determine when the iterative refinement of the decoding estimates should be halted.

Figure 7:
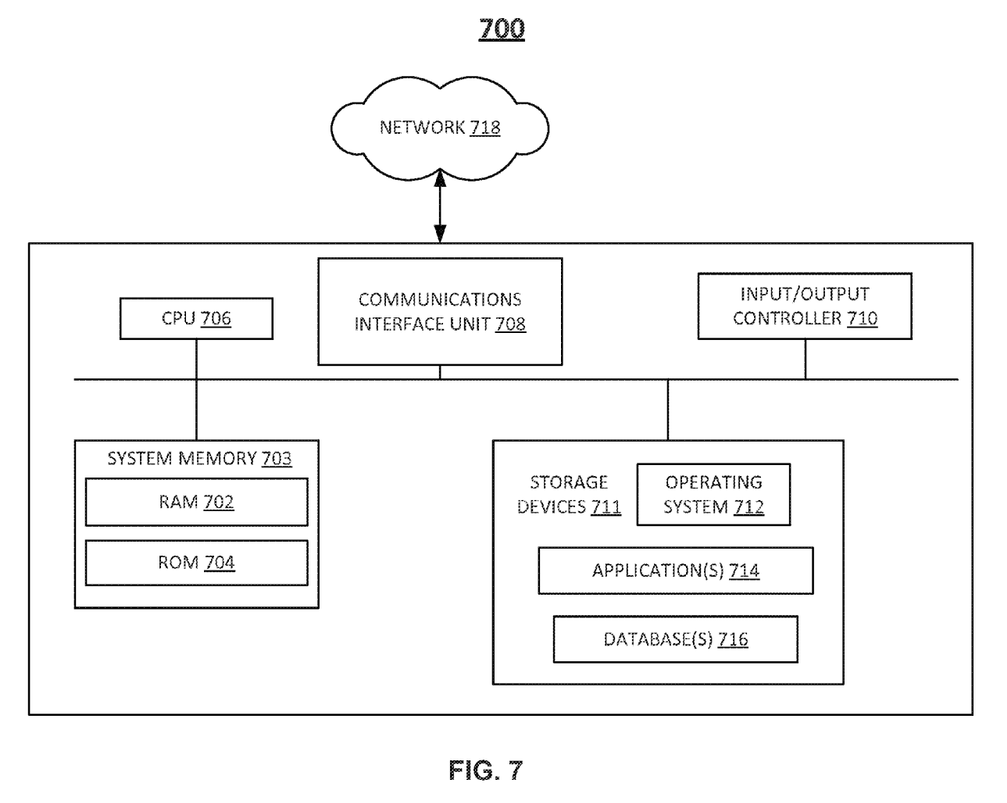
FIG. 7 shows a block diagram of a computing device, for performing any of the processes described herein, in accordance with an embodiment of the present disclosure.

FIG. 7 is a block diagram 700 of a computing device, such as any of the user equipment devices of FIG. 1, for performing any of the processes described herein, in accordance with an embodiment of the disclosure. Each of the components of these systems may be implemented on one or more computing devices 700. In certain aspects, a plurality of the components of these systems may be included within one computing device 700. In certain embodiments, a component and a storage device 711 may be implemented across several computing devices 700.

The computing device 700 comprises at least one communications interface unit 708, an input/output controller 710, system memory 703, and one or more data storage devices 711. The system memory 703 includes at least one random access memory (RAM 702) and at least one read-only memory (ROM 704). All of these elements are in communication with a central processing unit (CPU 706) to facilitate the operation of the computing device 700. The computing device 700 may be configured in many different ways. For example, the computing device 700 may be a conventional standalone computer, or, alternatively, the functions of computing device 700 may be distributed across multiple computer systems and architectures. In FIG. 7, the computing device 700 is linked, via network 718 or local network, to other servers or systems.

The computing device 700 may be configured in a distributed architecture, wherein databases and processors are housed in separate units or locations. Some units perform primary processing functions and contain at a minimum a general controller or a processor and a system memory 703. In distributed architecture embodiments, each of these units may be attached via the communications interface unit 708 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to Ethernet, SAP, SAS™, ATP, BLUETOOTH™, GSM and TCP/IP.

The CPU 706 comprises a processor, such as one or more conventional microprocessors and one or more supplementary co-processors such as math co-processors for offloading workload from the CPU 706. The CPU 706 is in communication with the communications interface unit 708 and the input/output controller 710, through which the CPU 706 communicates with other devices such as other servers, user terminals, or devices. The communications interface unit 708 and the input/output controller 710 may include multiple communication channels for simultaneous communication with, for example, other processors, servers or client terminals.

The CPU 706 is also in communication with the data storage device 711. The data storage device 711 may comprise an appropriate combination of magnetic, optical or semiconductor memory, and may include, for example, RAM 702, ROM 704, a flash drive, an optical disc such as a compact disc, or a hard disk or drive. The CPU 706 and the data storage device 711 each may be, for example, located entirely within a single computer or other computing device, or connected to each other by a communication medium, such as a USB port, serial port cable, a coaxial cable, an Ethernet cable, a telephone line, a radio frequency transceiver or other similar wireless or wired medium or combination of the foregoing. For example, the CPU 706 may be connected to the data storage device 711 via the communications interface unit 708. The CPU 706 may be configured to perform one or more particular processing functions.

The data storage device 711 may store, for example, (i) an operating system 712 for the computing device 700; (ii) one or more applications 714 (e.g., a computer program code or a computer program product) adapted to direct the CPU 706 in accordance with the systems and methods described here, and particularly in accordance with the processes described in detail with regard to the CPU 706; or (iii) database(s) 716 adapted to store information that may be utilized to store information required by the program.

The operating system 712 and applications 714 may be stored, for example, in a compressed, an uncompiled and an encrypted format, and may include computer program code. The instructions of the program may be read into a main memory of the processor from a computer-readable medium other than the data storage device 711, such as from the ROM 704 or from the RAM 702. While execution of sequences of instructions in the program causes the CPU 706 to perform the process steps described herein, hard-wired circuitry may be used in place of, or in combination with, software instructions for embodiment of the processes of the present disclosure. Thus, the systems and methods described are not limited to any specific combination of hardware and software.

Suitable computer program code may be provided for performing one or more functions in relation to synchronization signal acquisition as described herein. The program also may include program elements such as an operating system 712, a database management system and "device drivers" that allow the processor to interface with computer peripheral devices (e.g., a video display, a keyboard, a computer mouse, etc.) via the input/output controller 710.

The term "computer-readable medium" as used herein refers to any non-transitory medium that provides or participates in providing instructions to the processor of the computing device 700 (or any other processor of a device described herein) for execution. Such a medium may take many forms, including, but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, a hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer may read.

Various forms of computer-readable media may be involved in carrying one or more sequences of one or more instructions to the CPU 706 (or any other processor of a device described herein) for execution. For example, the instructions may initially be borne on a magnetic disk of a remote computer (not shown). The remote computer may load the instructions into its dynamic memory and send the instructions over an Ethernet connection, cable line, or even telephone line using a modem. A communications device local to a computing device 700 (e.g., a server) may receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

The foregoing is merely illustrative of the principles of this disclosure, and various modifications can be made without departing from the scope of the present disclosure. The above described embodiments of the present disclosure are presented for purposes of illustration and not of limitation, and the present disclosure is limited only by the claims that follow.

What is claimed is:

1. A method for decoding a codeword having a first codeword length using a decoding system, the method comprising:
   receiving a vector corresponding to the codeword at the decoding system, wherein:
      the decoding system comprises a first decoder and a second decoder,
      the first decoder is available to concurrently process codewords up to the first codeword length, and
      the second decoder is available to concurrently process codewords up to a second codeword length different from the first codeword length;
   generating soft information based on the received vector, wherein the generated soft information comprises likelihood metrics having a third codeword length different from the first and the second codeword lengths;
   determining that the received vector is to be decoded using the second decoder;
   in response to determining that the received vector is to be decoded using the second decoder, partitioning the generated soft information into a plurality of segments having a size no larger than the second codeword length; and
   decoding the plurality of segments using the second decoder.

2. The method of claim 1, wherein the first decoder performs decoding based on a bit-flipping algorithm and the second decoder performs decoding based on an iterative message-passing algorithm.

3. The method of claim 1, wherein the codeword belongs to a low-complexity parity check (LDPC) code having a parity check matrix, and partitioning the generated soft information comprises:
   partitioning the generated soft information into a plurality of segments based on a structure of the parity check matrix.

4. The method of claim 3, wherein the parity check matrix has a lower triangular block structure.

5. The method of claim 1, wherein determining that the received vector is to be decoded using the second decoder comprises:
   attempting to decode the received vector with the first decoder; and
   determining that the decoding attempt has resulted in a decoding failure.

6. The method of claim 1, further comprising:
   determining that the received vector is to be decoded using the first decoder; and
   decoding the received vector concurrently using the first decoder, in response to the determining.

7. The method of claim 1, wherein decoding the plurality of segments using the second decoder comprises:
   processing a first segment of the received vector using the second decoder to obtain a decoding estimate of a first segment of the codeword;
   processing, using the second decoder, a second segment of the received vector and the decoding estimate of the first segment of the received vector to obtain a decoding estimate of a second segment of the codeword.

8. The method of claim 1, wherein a first decoding algorithm used by the first decoder has lower complexity than a second decoding algorithm used by the second decoder.

9. The method of claim 1, wherein the codeword belongs to a cascade LDPC code.

10. A decoding system comprising:
a first decoder available to concurrently process codewords up to a first codeword length;
a second decoder available to concurrently process codewords up to a second codeword length different from the first codeword length;
soft-information generation circuitry configured to generate soft information comprising likelihood metrics having a third codeword length different from the first and the second codeword lengths; and
control circuitry configured to:
receive a vector corresponding to a codeword having the first codeword length;
generate the soft information based on the received vector;
determine that the received vector is to be decoded using the second decoder;
in response to determining that the received vector is to be decoded using the second decoder, partition the generated soft information into a plurality of segments having a size no larger than the second codeword length; and
decode the plurality of segments using the second decoder.

11. The decoding system of claim 10, wherein the first decoder performs decoding based on a bit-flipping algorithm and the second decoder performs decoding based on an iterative message-passing algorithm.

12. The decoding system of claim 10, wherein the codeword belongs to a low-complexity parity check (LDPC) code having a parity check matrix, and the control circuitry is further configured to:
partition the generated soft information into a plurality of segments based on a structure of the parity check matrix.

13. The decoding system of claim 12, wherein the parity check matrix has a lower triangular block structure.

14. The decoding system of claim 10, wherein the control circuitry is configured to determine that the received vector is to be decoded using the second decoder comprises by being further configured to:

attempt to decode the received vector with the first decoder; and
determine that the decoding attempt has resulted in a decoding failure.

15. The decoding system of claim 10, wherein the control circuitry is further configured to:
determine that the received vector is to be decoded using the first decoder; and
decode the received vector concurrently using the first decoder, in response to the determining.

16. The decoding system of claim 10, wherein the control circuitry is configured to decode the plurality of segments using the second decoder by being further configured to:
process a first segment of the received vector using the second decoder to obtain a decoding estimate of a first segment of the codeword;
process a second segment of the received vector and the decoding estimate of the first segment of the codeword to obtain a decoding estimate of a second segment of the codeword.

17. The decoding system of claim 10, wherein a first decoding algorithm used by the first decoder has lower complexity than a second decoding algorithm used by the second decoder.

18. The decoding system of claim 10, wherein the codeword belongs to a cascade LDPC code.

19. A decoding system comprising:
a first decoder of a first complexity;
a second decoder of a second complexity different from the first complexity;
soft information generation circuitry having a third complexity different from the first and the second complexities; and
control circuitry configured to:
receive a vector associated with a codeword;
generate soft information comprising likelihood metrics based on the received vector;
process the generated soft information jointly using the first decoder, in response to determining that processing the codeword with the first decoder is associated with a complexity that is less than or equal to the first complexity; and
process portions of the generated soft information separately using the second decoder, in response to determining that processing the codeword with the second decoder is associated with a complexity that exceeds the second complexity.

* * * * *